US010191113B2

(12) United States Patent
Hasse et al.

(10) Patent No.: US 10,191,113 B2
(45) Date of Patent: Jan. 29, 2019

(54) APPARATUS HAVING SIMULATION UNIT FOR PRODUCING SIMULATION SIGNAL FOR TESTING AN ELECTRICAL COMPONENT

(71) Applicant: dSPACE digital signal processing and control engineering GmbH, Paderborn (DE)

(72) Inventors: Dirk Hasse, Salzkotten (DE); Peter Scheibelhut, Paderborn (DE); Robert Polnau, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 188 days.

(21) Appl. No.: 14/556,830

(22) Filed: Dec. 1, 2014

(65) Prior Publication Data

US 2015/0153413 A1    Jun. 4, 2015

Related U.S. Application Data

(63) Continuation of application No. PCT/EP2013/057338, filed on Apr. 9, 2013.

(30) Foreign Application Priority Data

Jun. 1, 2012    (DE) .................. 10 2012 104 778

(51) Int. Cl.
  *G01R 31/319*    (2006.01)
  *G06F 11/26*    (2006.01)
  *G01R 31/00*    (2006.01)

(52) U.S. Cl.
  CPC ..... *G01R 31/31917* (2013.01); *G01R 31/005* (2013.01); *G06F 11/26* (2013.01)

(58) Field of Classification Search
  CPC ...................... H04L 43/50; H04L 12/2697
  See application file for complete search history.

(56) References Cited

U.S. PATENT DOCUMENTS 8,494,803 B2 * 7/2013 Hasse ................ G05B 19/0426
                                                       702/117
8,874,421 B2    10/2014 Stünkel et al.
(Continued)

FOREIGN PATENT DOCUMENTS

DE    10 2007 029 137 A1    1/2009
DE    10 2009 048 981 A1    4/2011
(Continued)

OTHER PUBLICATIONS

Japanese Office Action for Japanese Application No. 2015-514389 dated Mar. 22, 2016 with English translation.

*Primary Examiner* — Jermele M Hollington
*Assistant Examiner* — Feba Pothen
(74) *Attorney, Agent, or Firm* — Muncy, Geissler, Olds & Lowe, P.C.

(57) ABSTRACT

An apparatus for testing an electrical component, having a simulation unit for producing a simulation signal, a plurality of test units, and at least one electrical connecting device, whereby the simulation unit and the plurality of test units are connected or connectable to each other in an electrically conductive fashion via the at least one connecting device, and the at least one connecting device has at least one electrical switch device, which is situated to make or break an electrical connection between the plurality of test units.

26 Claims, 6 Drawing Sheets

(56) References Cited

U.S. PATENT DOCUMENTS

| | | | |
|---|---|---|---|
| 2001/0008006 A1 | 7/2001 | Klein | |
| 2002/0180707 A1* | 12/2002 | Sato | G06F 3/0202 345/169 |
| 2005/0110349 A1* | 5/2005 | Bertrand | H03K 17/18 307/112 |
| 2011/0115517 A1* | 5/2011 | Kwon | G01R 31/31908 324/762.01 |
| 2012/0041706 A1* | 2/2012 | Li | H04L 12/2697 702/118 |
| 2012/0119765 A1 | 5/2012 | Bracker et al. | |
| 2012/0249811 A1* | 10/2012 | Ganahl | H04N 5/23206 348/207.99 |
| 2013/0051252 A1* | 2/2013 | Ciavattone | H04L 43/10 370/252 |
| 2013/0060970 A1 | 3/2013 | Cloury et al. | |

FOREIGN PATENT DOCUMENTS

| | | |
|---|---|---|
| DE | 10 2010 043 661 A1 | 5/2012 |
| EP | 1 722 244 A1 | 11/2006 |
| EP | 2 015 084 A2 | 1/2009 |
| JP | S 62-128324 U | 8/1987 |
| JP | H 04-70569 A | 3/1992 |
| JP | 2005-148810 A | 6/2005 |
| JP | 2007-246040 A | 9/2007 |
| JP | 2008-039452 A | 2/2008 |
| JP | 2008-261793 A | 10/2008 |
| JP | 2011-081000 A | 4/2011 |
| JP | 2012-105536 A | 5/2012 |
| WO | WO 2011/101559 A1 | 8/2011 |

* cited by examiner

APPARATUS HAVING SIMULATION UNIT FOR PRODUCING SIMULATION SIGNAL FOR TESTING AN ELECTRICAL COMPONENT

This nonprovisional application is a continuation of International Application No. PCT/EP2013/057338, which was filed on Apr. 9, 2013, and which claims priority to German Patent Application No. DE 10 2012 104 778.2, which was filed in Germany on Jun. 1, 2012, and which are both herein incorporated by reference.

BACKGROUND OF THE INVENTION

Field of the Invention

The present invention relates to an apparatus for testing an electrical component having a simulation unit for producing a simulation signal, a plurality of test units, and at least one electrical connecting device. The simulation unit and the plurality of test units are connected or connectable to each other in an electrically conductive fashion via the at least one electrical connecting device.

Description of the Background Art

An apparatus for testing an electrical component is frequently referred to as a "testing apparatus" or a "simulator system."

An extremely wide range of embodiments of apparatuses for testing electrical components such as a control system for a motor vehicle or an automation unit are known from the conventional art and are primarily used in applied research, industrial development, and other application areas, in particular the fields of mechatronics, automotive applications, aerospace engineering, systems and process engineering, and other technical fields that require the execution of process control tasks. In this context, therefore, a "control system" can be understood to mean a technical apparatus that essentially can be used for measurement, control, and/or regulation. In the broadest sense, it is generally an electrical, for example program-controllable system that is usually referred to as a "control unit," particularly in the field of automotive applications. In this regard, a control system is not restricted only to the system theory definition of a control, but is also usually used to carry out regulation procedures.

Apparatuses for testing a control system that are known from the conventional art frequently have a simulation unit for producing, measuring, and/or analyzing a simulation signal, a plurality of test units for connecting the control system, and at least one connecting device such as a bus bar or bus system. In the conventional art, there are known bus bars that have one or more electrical conductors that is/are separated from other electrical conductors by an insulator such as an insulating plastic and/or an air gap. In this case, the bus bar can be a component of a printed circuit board. A printed electrical conductor path of the printed circuit board can, for example, on the one hand be partially enclosed in plastic and on the other hand, can be partially insulated from other electrical conductors by an air gap. A connecting device can, for example, be provided with two separate conductors.

In such apparatuses, it is disadvantageous that parasitic properties of the connecting device interfere with and/or alter the simulation signals. In other words, the parasitic properties of the bus bar or bus system cause a distortion of the simulation, which in the end can result in an error-encumbered test of the control system. In this regard, test results can be distorted and lead to incorrect results.

For purposes of error simulation, many components can be connected to the connecting device, which promotes the distortion of test results. Parasitic capacitances increase with the number of components connected and can have an effect across various switch cabinets over which the apparatus is distributed. It can also be necessary for high currents to be supported in the connecting device, which is why sufficient conductor cross-sections and/or sufficient conductor path widths (e.g. in printed circuit boards) must be selected for the connecting device. Furthermore, the use of power semiconductors is on the rise; these have switching behaviors whose timing is defined in a comparatively precise way. Both of these approaches, i.e. conductor paths for high currents and power semiconductors, promote the occurrence of parasitic capacitances that can have an interfering impact on sensitive signals. As a rule, the parasitic capacitance of bus bars increases with the number of interconnected components.

An error simulation can be desirable both at the level of a single control unit and also at the level of the combination. In this context, the design of the apparatus must be adapted to the respective test. A generic test design is only possible to a limited degree since the design itself, particularly the connecting device, can further distort the test results. In addition, testing a plurality of separate control units simultaneously and independently of one another is only possible with such a design after a corresponding configuration. For example, components in different racks can be connected to produce a test setup.

In this case, simultaneous and independent error simulations in the different racks are not possible.

Examples of a rack include a switch cabinet or a so-called 19-inch cabinet. As a rule, a rack can include a plurality of so-called sub-racks, where the sub-racks can be embodied, for example, as so-called subassembly supports, for example, as so-called 19-inch subassembly supports.

Various simulation signals can be used for testing an electrical component. For this reason, signals that are to be conveyed via the connecting device can be almost arbitrarily embodied and range from small sensor signals, also referred to as "low-level" below to large actuator signals, also referred to as "high-level" below.

A conceptual assignment of sensor signals to the high-level or low-level categories can differ depending on the embodiment of the test device. For example, it is possible to define all signals that have a maximum electrical voltage amount $U_{max} \leq 10$ mV and/or that have a maximum electrical current amount of $I_{max} \leq 10$ mA for assignment to the group of low-level signals. An exemplary determination for the group of high-level signals can define that all signals that have a maximum electrical voltage amount of $U_{max} \geq 5$ V and/or that have a maximum electrical current amount of $I_{max} \geq 100$ mA must be assigned to the group of high-level signals.

In this illustrated example, the signals that are quantitatively larger than the low-level signals, but quantitatively smaller than the high-level signals are, according to the above mentioned exemplary determination, nevertheless assigned to the group of high-level signals. The high-level range and low-level range can in principle be arbitrarily defined, but the high-level range always has larger values (voltage, current, and/or power) than the low-level range.

As a rule, a technical separation of the signals according to high and low level is not practically possible, for example, because at the time of the project planning for the apparatus, the boundary conditions are not known or a temporary implementation of a short circuit of a high-level signal to the low-level signal is explicitly required for testing purposes, for example in order to use the testing apparatus to simulate, for an electrical component to be tested, appropriate technical boundary conditions in the event of an error.

SUMMARY OF THE INVENTION

It is therefore an object of the present invention to provide an apparatus for testing an electrical component, which delivers improved test results and enables a simple performance of the test.

The invention therefore provides in an embodiment, an apparatus for testing an electrical component. The apparatus is embodied with a simulation unit for producing a simulation signal, a plurality of test units, and at least one electrical connecting device. The simulation unit and the plurality of test units are connected or connectable to each other in an electrically conductive fashion via the at least one electrical connecting device and the at least one electrical connecting device has at least one electrical switch device that is designed to break or make an electrical connection between the plurality of test units.

The basic idea of the present invention, therefore, is to interrupt the connecting device so that the number of test units connected with the connecting device and the size of the connecting device itself are limited. The limitation can be carried out by an amount that is adapted to the respective simulation signal. In particular, this reduces parasitic capacitances that can occur in the connecting device. A feedback from parts of the connecting device or unused test units, for example in the form of a signal distortion of a simulation signal, is avoided or at least reduced. The at least one switch device is a component of the connecting device and produces an interruption within the connecting device in order to connect individual parts of the connecting device—and thus test units—to each other and to the simulation unit. Correspondingly, it is also possible to test a plurality of individual control units simultaneously and independently of each other and to isolate test units within the apparatus. In the embodiment of the apparatus with a connecting device, this connecting device can be permanently connected to the simulation unit and the test units. The connecting device, the simulation unit, and some of the test units can be situated inside the apparatus and can comprise a structural unit together with the apparatus, for example in the form of a rack or several connected racks.

The at least one switch device can be actuated in any way. For example, a control unit of the apparatus can switch all of the switch devices centrally. Alternatively and/or additionally, all or some of the switch devices can be switched in a decentralized way. Furthermore, the switch devices can be embodied for a manual actuation. The switch devices can be arbitrarily embodied as either a normally closed contact or a normally open contact.

Basically, the test unit can be equipped arbitrarily. According to an embodiment of the invention, though, the test unit can be equipped with a connection for a sensor, an actuator, and/or a control unit. For example, the sensor can be embodied as an original sensor of a motor vehicle such as a rain sensor and the actuator is embodied as an original load such as an electromechanical power steering system, i.e. as an "electric power assisted steering system" or EPAS system, in particular including a program-controlled electric servomotor. In addition, the test unit can be embodied as part of an I/O device. I/O devices include in particular devices with analog and digital input and output channels, devices with intelligent signal processing for preprocessing and postprocessing of raw data or other data, data bus modules, devices for signal coding, or for example modules for controlling actuators, i.e. in particular actuators in the sense of actuating elements inside a control system.

In an embodiment of the invention, the apparatus can include a plurality of electric connecting devices, which differ from one another with regard to at least one electrical property, and includes a selecting device for selecting an electrical connection of the simulation unit and the plurality of test units to one of the connecting devices, in which the plurality of connecting devices each have at least one respective electric switch device and these switch devices are arranged so that they can make or break an electrical connection between the plurality of test units via the corresponding connecting device. Because of the different electrical properties of the connecting devices, they have different parasitic properties. A signal distortion due to the parasitic property can therefore be adapted to the simulation signal so that the latter depends only slightly on the parasitic property. Unwanted changes to the simulation signal due to leakage currents, capacitances, inductances, or power losses, for example due to a property of an electric conductor and/or its insulation, can be reduced or essentially prevented. The parasitic property of a connecting device in particular also includes an insufficient dielectric strength or an insufficient insulating strength, which essentially depends on the material, substance, and/or geometry, for example the thickness of an insulator surrounding the electrical conductor. The selecting device can, for example, be embodied in the form of a switch. The selection of the connecting device via the selecting device can be carried based on a presettable parameter—e.g. based on a table or a measurement—and/or by a computer program in order to obtain a signal that is distorted as little as possible.

In an embodiment of the invention, a majority of electrical switch devices of a majority of connecting devices can be embodied together as a switch unit. Consequently, regardless of the selected connecting device, a desired region of the connecting device can be connected to or disconnected from associated test units by actuating a single switch unit. It is not necessary to know anything about the selected connecting device.

In an embodiment of the invention, the at least one switch device can have at least one electrical property that is adapted to at least one electrical property of the connecting device that includes the switch device. For example, connecting devices for high currents, i.e. for high-level currents, can be embodied with switch devices that are able to withstand these high currents. On the other hand, connecting devices for low currents, i.e. for low-level currents, can be embodied with corresponding switch devices for low currents. For example, commercially available contactors for 30 V and 30 A typically have 5 V or 100 mA as the lower specified threshold values for the switch voltage or switch current. Signals below this threshold value cannot be reliably transmitted via such a contactor. This correspondingly prevents unsuitable switch devices from causing additional errors in the simulation signal.

In an embodiment of the invention, the at least one connecting device and the at least one switch device can be integrally embodied in the form of a functional unit. A structural unit can be formed, which includes the at least one connecting device and the at least one switch device.

In another embodiment of the invention, the apparatus can be embodied to switch the at least one switch device in a load-free and/or voltage-free fashion. Consequently, it is not necessary to provide a particular switching capability of the switch device so that simple and inexpensive switch devices can be used. For example, before a test is carried out, the apparatus can be configured by switching the switch devices. Only when the test is performed, are signals transmitted via the connecting device and thus the switch devices.

In an embodiment of the invention, the at least one electrical connecting device can be hierarchically situated in at least two levels and the at least one switch device is situated to make or break a connection between two levels. This enables a simple assignment and connection of test units. For example, the apparatus can be distributed over a plurality of racks functioning as one level and each of these racks can be composed of a plurality of sub-racks functioning as other levels. Each sub-rack can in turn contain modules that constitute a third level.

In an embodiment of the invention, the at least one switch device can include a semiconductor switch. The semiconductor switch, for example a transistor, can be embodied singly or multiply, for example several connected in series, and permits a multitude of switching events with a good reliability. Semiconductor switches can usually be switched more precisely than electromechanical switches.

In another embodiment of the invention, the semiconductor switch can be a MOSFET. The MOSFET permits an efficient and precisely timed switching and has low losses. In comparison to an electromechanical switch such as a relay or a contactor, the MOSFET is usually less susceptible to wear because the MOSFET does not usually produce any break arcing when breaking a circuit. MOSFETs, in particular so-called power MOSFETs, are also suitable for transmitting powerful currents.

In an embodiment of the invention, the semiconductor switch can include a series circuit composed of two MOSFETs that are essentially identically structured, whereby each MOSFET has a body diode and the semiconductor switch is embodied so that the respective conducting directions of the body diodes of the two MOSFETs are oriented in opposite directions from each other. Correspondingly, the switch device is able to switch each current direction individually. The body diode is an integral component of the respective MOSFET.

In an embodiment of the invention, the at least one switch device can have an electromechanical switch. The electromechanical switch is suitable for transmitting powerful currents. The particular advantage of an electromechanical switch in the switch device is that in comparison to the semiconductor switch, the electromechanical switch has no body diode and thus for the electromechanical switch, the current direction is generally meaningless. Another advantage of the electromechanical switch is that its parasitic capacitance is essentially negligible.

In another embodiment of the invention, at least one test unit can be connected to an electronic control unit. In the remainder of the text, the term "electronic control unit" will be shortened to "control unit." The control unit represents an electrical component to be tested. The control unit is in particular a control unit of a motor vehicle, a rail vehicle, a flying object, and/or an automation unit. In the prior art, such control units are often referred to as an "electronic control unit" or ECU for short, in particular as an automotive ECU. The use of the terms "electrical" component and "electrical" control unit does not exclude the possibility that, in addition to electrical, in particular electronic components, for example also optical components and/or optoelectronic components are contained in the electrical components or in the control unit.

In an embodiment of the invention, the simulation unit can be embodied as integrally joined to at least one test unit. Correspondingly, a module can be formed, which includes different functionalities and is thus usable for various applications. For connection purposes, the module has signal outputs and/or signal inputs.

In an embodiment of the invention, the at least one switch device can have a parallel circuit of a plurality of switch elements. This makes it possible to transmit a signal via the plurality of switch elements, thus reducing the parasitic losses on the whole. In the selection of a suitable switch, a so-called power MOSFET or a contactor is preferable for high switching capacities. Contactors, also referred to as electric contactors, generally have a good stopband attenuation and a negligibly low leakage current. However, there are relatively strict requirements with regard to the minimum switching voltage and minimum switching current. Consequently, commercially available contactors for 30 V and 30 A, for example, generally have 5 V as a minimum value for the switching voltage and 100 mA as a minimum value for the switching current. Signals below these thresholds values cannot be reliably connected to such a component. Other critical points in the so-called high-power range include the comparatively large sizes (e.g. of electric contactors), the sometimes very high acquisition costs, and the high control power. In the present case, a signal current is distributed over all of the switch elements of the parallel circuit so that in sum, powerful currents, i.e. high-level currents, can be transmitted by the parallel circuit composed of the plurality of switch elements. In this case, each switch element can be smaller than a single switch element with the same switching power, thus reducing the above-mentioned disadvantages. In addition, for example, embodying switch devices with a plurality of individual switch elements that are each individually embodied for low-level currents is often less expensive than doing so with a single switch element that is embodied for high-level currents.

In an embodiment of the invention, the apparatus can be embodied to control the switch elements of a switch device together. The switch elements can, for example, be controlled via a shared switching current. This assures in a simple way that all of the switch elements have the same switching state. The control can be carried out from a central control unit or locally, for example by the switch device itself.

In an embodiment of the invention, the at least one switch device can have a switch element for transmitting small signals, i.e. for transmitting low-level signals. Signals with voltages of no more than a few tens of volts and currents of less than 10 A are considered small signals. In particular, the transmission relates to a closed state of the switch device since when unsuitable switch elements are used, even in the closed or conductive state, it is not possible—or not reliably possible—to transmit small signals.

In an embodiment of the invention, the at least one switch device can have a current-limiting element that is assigned to the switch element for transmitting small signals. The current-limiting element can, for example, be embodied in the form of a fuse in order to prevent damage to the switch element.

In an embodiment of the invention, the at least one switch device can have a plurality of switch elements for transmitting small signals. On the one hand, this permits reliable transmission of a small signal while on the other hand, large signals, in particular large currents, can be transmitted jointly via the parallel switch elements. Each of the switch elements can be assigned a current-limiting element.

In an embodiment of the invention, the at least one switch device can be embodied to produce a uniform or essentially uniform distribution of the signal current to the plurality of switch elements. This ensures that none of the switch devices alone can be damaged by a nonuniform distribution of the currents. The uniform current distribution can be produced via a suitable printed circuit board layout. Alternatively and/or additionally, elements that have a positive temperature coefficient of the electric resistance, i.e. for example so-called components with PTC characteristics (PTC=positive temperature coefficient) are used, for example circuit breakers such as polymer-based self-resetting circuit breakers (so-called PPTC circuit breakers) or conductor paths with PTC characteristics.

In an embodiment of the invention, the at least one switch device can have a switch element for transmitting large signals. Large signals, i.e. high-level signals, are actuator signals for producing an actuation. The actuation can, for example, be the movement of a lever driven by an electric motor or the opening of a hydraulic valve. Such large signals can consequently, for example, be currents of several amperes and voltages that are, for example, greater than 12 V, in a specific example, 30 V and 30 A. Consequently, large signals can reliably flow through the switch device.

In an embodiment of the invention, the at least one switch device can have a switch element for transmitting small signals and a switch element for transmitting large signals. This correspondingly produces a combination to permit transmission of both small signals and large signals with one switch device. It is also possible to combine a plurality of switch elements for transmitting small and large signals.

In an embodiment of the invention, at least one switch element can include a semiconductor switch. The semiconductor switch, for example a transistor, can be simply embodied and permits a multitude of switching events with a good reliability.

In an embodiment of the invention, the semiconductor switch can be embodied as described above. Correspondingly, each individual switch element can be embodied with a MOSFET or with a series circuit composed of two MOSFETs, whereby the two MOSFETs can be arranged in series such that the body diode of the first MOSFET of the series circuit is oriented in the opposite direction from the body diode of the second MOSFET of the series circuit.

In an embodiment of the invention, at least one switch element can be embodied in the form of an electromechanical switch. Corresponding switches can, for example, be relays or contactors, which are intrinsically known. Contactors are usually used for switching and transmitting large currents and have a high dielectric strength. These properties also apply to relays used for high-level applications.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
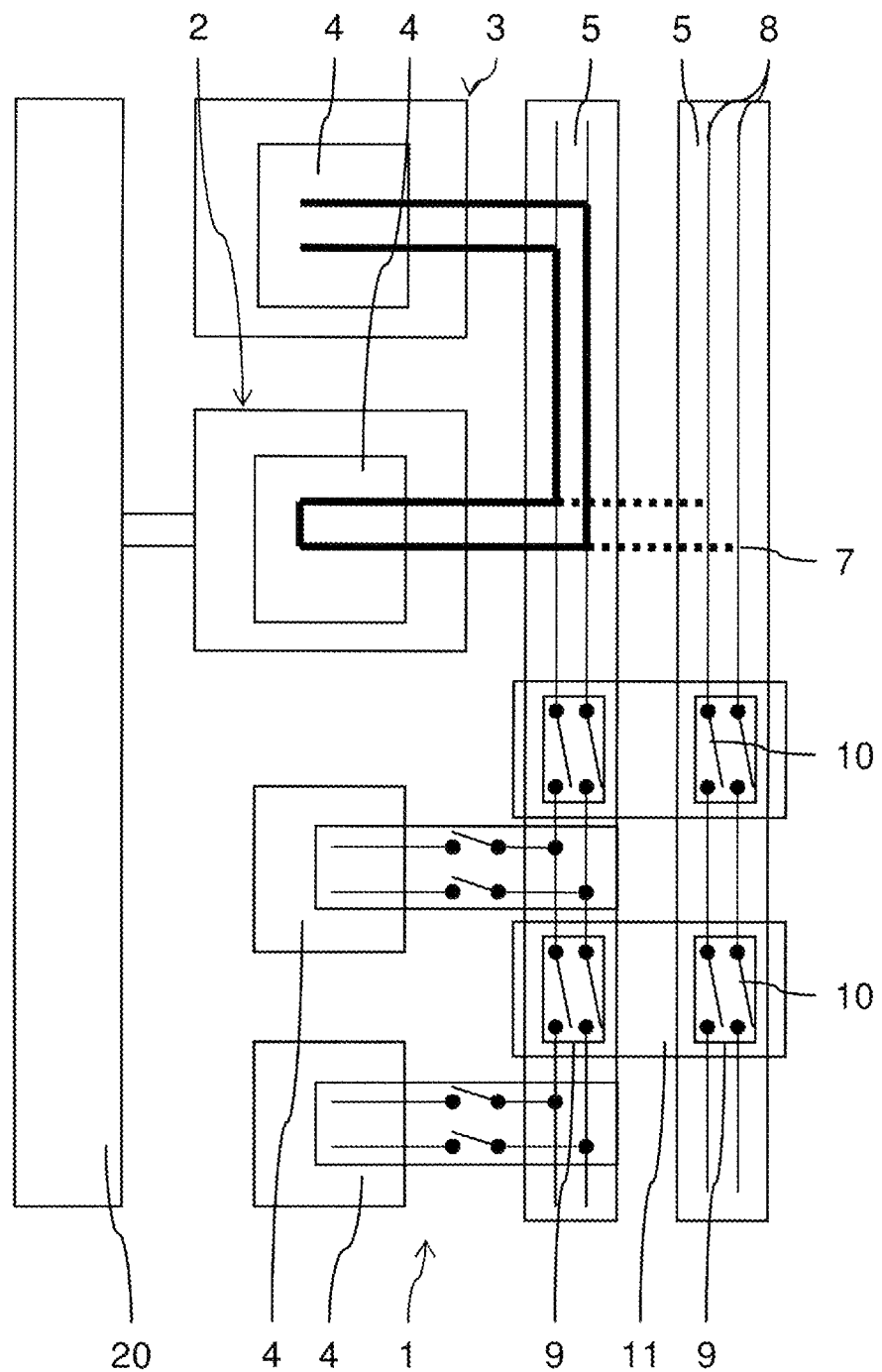
FIG. 1 is a schematic depiction of an apparatus for testing an electrical component according to a first embodiment of the invention.

FIG. 1 is a schematic depiction of an apparatus 1 for testing an electrical component 20 such as a control unit or control system for a motor vehicle or an automation unit according to a first embodiment of the invention. The apparatus 1 has a simulation unit 2 and a routing unit 3, each of which includes an internal test unit 4. In addition, the apparatus 1 according to the preferred embodiment has two separate test units 4.

The simulation unit 2 is able to generate and/or modify a simulation signal and is thus in particular able to simulate an error-free and/or error-encumbered operating state of the electrical component and/or to simulate an error-free and/or error-encumbered operating state of a technical environment of the electrical component, whereby this technical environment transmits electrical signals to the electrical component and/or receives electrical signals from the electrical component. The simulation signal can have a current and/or a voltage and the current and/or voltage can additionally include a resistive portion, a capacitive portion, an inductive portion, and/or a frequency portion. In the present case, the simulation unit 2 includes an error-contributing unit, also known as a failure insertion unit, referred to as an FIU for short. The simulation signal can also be a short circuit, as indicated in FIG. 1. For example, two simulation signals can be reciprocally influenced via a limited-time short-circuiting of a first signal line that carries a first signal to a second signal line that carries a second signal.

The test units 4 are in particular used for connecting the electrical component 20, via the simulation unit 2, as shown in FIG. 1. In this case, each test unit 4 can have a sensor and/or a sensor system and/or an actuator and/or an actuator system. In the present example, a test unit 4 is embodied in the form of an actuator or actuator system and is connected to the control unit 20 of a motor vehicle, not shown, while another test unit 4 is embodied as a sensor or sensor system.

As is also clear from FIG. 1, the simulation unit 2, the routing unit 3, and the test units 4 can be connected in an electrically conductive fashion with two connecting devices 5. In this case, the simulation unit 2 can be connected to each of the connecting devices 5, as depicted by the dashed lines 7.

As also shown in FIG. 1, the apparatus 1 is configured so that the simulation unit 2, the routing unit 3, and the test units 4 are connected in an electrically conductive fashion to the same connecting device 5. Via a selecting device, which is embodied with a plurality of relays, the simulation unit 2, the routing unit 3, and the test units 4 can be connected in an electrically conductive fashion to one of the other connecting devices 5.

The routing unit 3 can be embodied in the form of a switchable electrical connecting device with which at least one predefined channel can be connected in an electrically conductive fashion via a switch or several switches to a connecting device 5 such as a bus bar that is associated with the channel for purposes of error simulation. The channel or channels is/are also connected to at least one signal source for generating at least one simulation signal or to a simulation signal sink for receiving at least one simulation signal. The signal sources and signal sinks are also included in the test unit 4 and/or the simulation unit 2. Each channel connected to a signal source or a signal sink constitutes a component for transmitting analog or digital simulation signals over a spatial distance.

The connecting devices 5 in the present instance are each embodied in the form of a bus bar with two electrical conductors 8; the connecting device 5 and the switch devices 9 are each integrally embodied as a functional unit. The functional unit being, for example, a single printed circuit board. The individual connecting devices 5 are each embodied with different electrical properties. In this case, one of the connecting devices 5 can be acted on with a current of up to 100 A and the other connecting device 5 can be acted on with a current of up to 1 A. Correspondingly, the electrical properties of the connecting devices 5, i.e. the linear electric constant, the resistance per unit length, the conductance per unit length, the capacitance per unit length, and/or the inductance per unit length of the individual connecting devices 5 are selected so that the signal distortion due to their parasitic properties is different when acted on with different simulation signals. The insulating strength of the connecting devices 5 in the present embodiment is 60 V, for example.

As also shown in FIG. 1, the connecting devices 5 each have a plurality of switch devices 9 in order to make or break an electrical connection between the multiple test units 4. The switch devices 9 here include an individual switch 10 for each electric conductor 8 of the connecting device 5. In this case, the electrical properties of each switch device 9 are adapted to the electrical properties of the connecting device 5 connected to the switch device 9, as explained above.

The switch devices 9 in the region of parallel connecting devices 5 are combined into switch units 11 and can be switched together by a switch signal.

Figure 2:
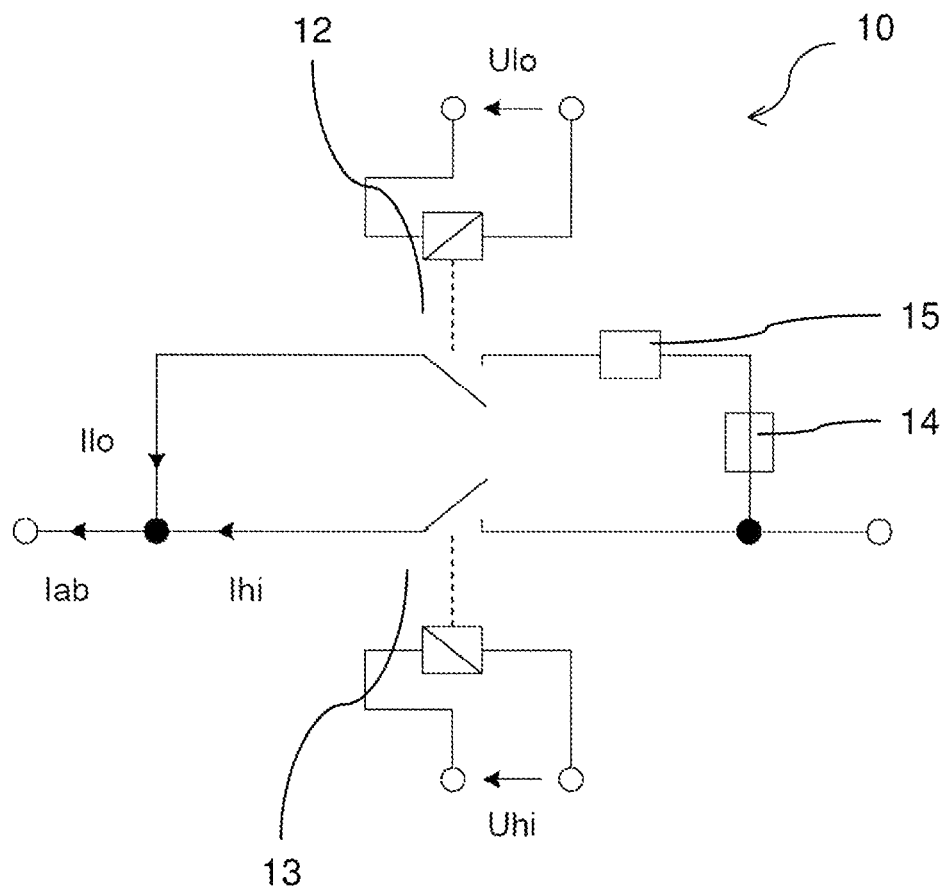
FIG. 2 is a detailed depiction of a single switch of a switch device of the apparatus from FIG. 1.

As shown in FIGS. 2 through 5, each individual switch 10 includes a parallel circuit composed of a plurality of switch elements 12, 13. In FIG. 2, an individual switch 10 is embodied with one switch element 12 for transmitting small signals and one switch element 13 for transmitting large signals. The two switch elements 12, 13 in this instance are embodied as electromechanical switches, for example as a contractor 13 and relay 12. The apparatus is embodied to control both switch elements 12, 13 of an individual switch together, i.e. to open or close them together.

A current-limiting element 14 and a resistor 15 can also be situated in a current path of the switch element 12, for example, a relay for transmitting small signals. This resistor 15 and/or the current-limiting element 14, for example, a fuse, can be dimensioned so that even a high-level signal does not cause an overload of the relay 12.

Figure 3:
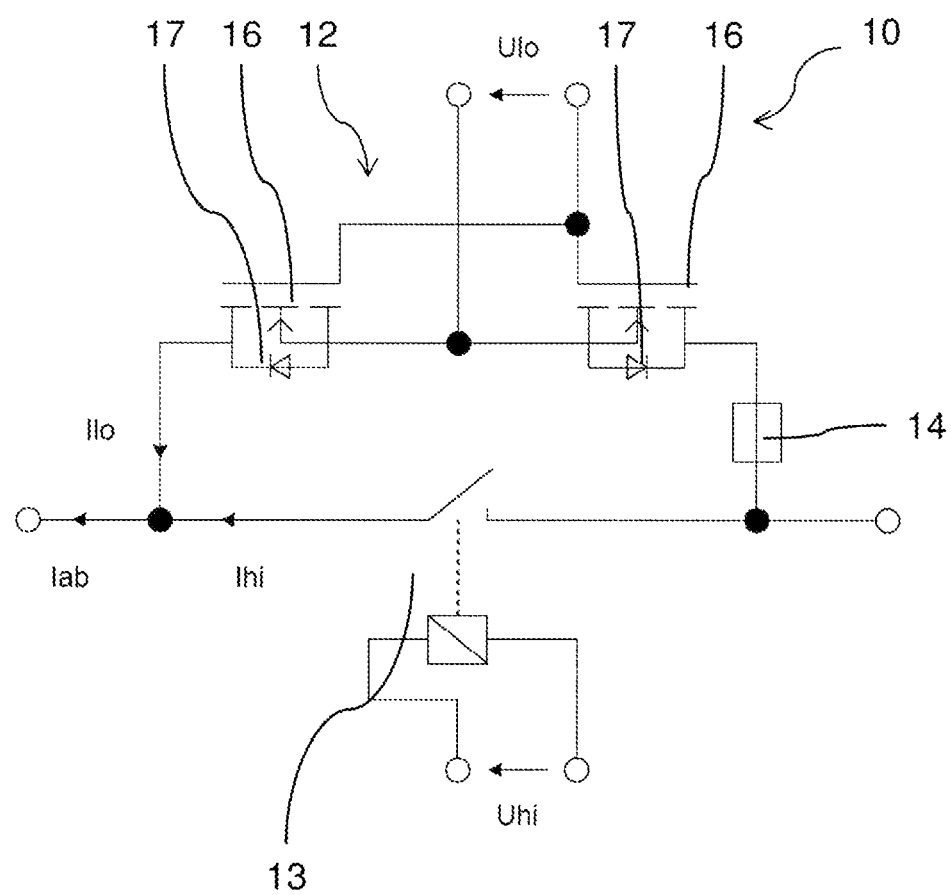
FIG. 3 is a detailed depiction of a single switch of a switch device of the apparatus from FIG. 1 according to a first modified embodiment.

FIG. 3 shows an individual switch 10 according to a first modified embodiment. The individual switch 10 of the first modified embodiment is essentially identical to the one described in relation to the first embodiment so that components that are the same have been provided with identical reference numerals.

The individual switch 10 according to the first modified embodiment differs from the one described previously in that the switch element 12 is embodied as a semiconductor switch in order to transmit small signals.

The switch element 12 for transmitting small signals includes a series circuit composed of two identical MOSFETs 16, each of which is embodied with a body diode 17. The conducting directions of the body diodes 17 of the two MOSFETs 16 in the series circuit are oriented in opposite directions from each other.

As a further difference, the single switch of the first modified embodiment does not have the resistor 15.

Figure 4:
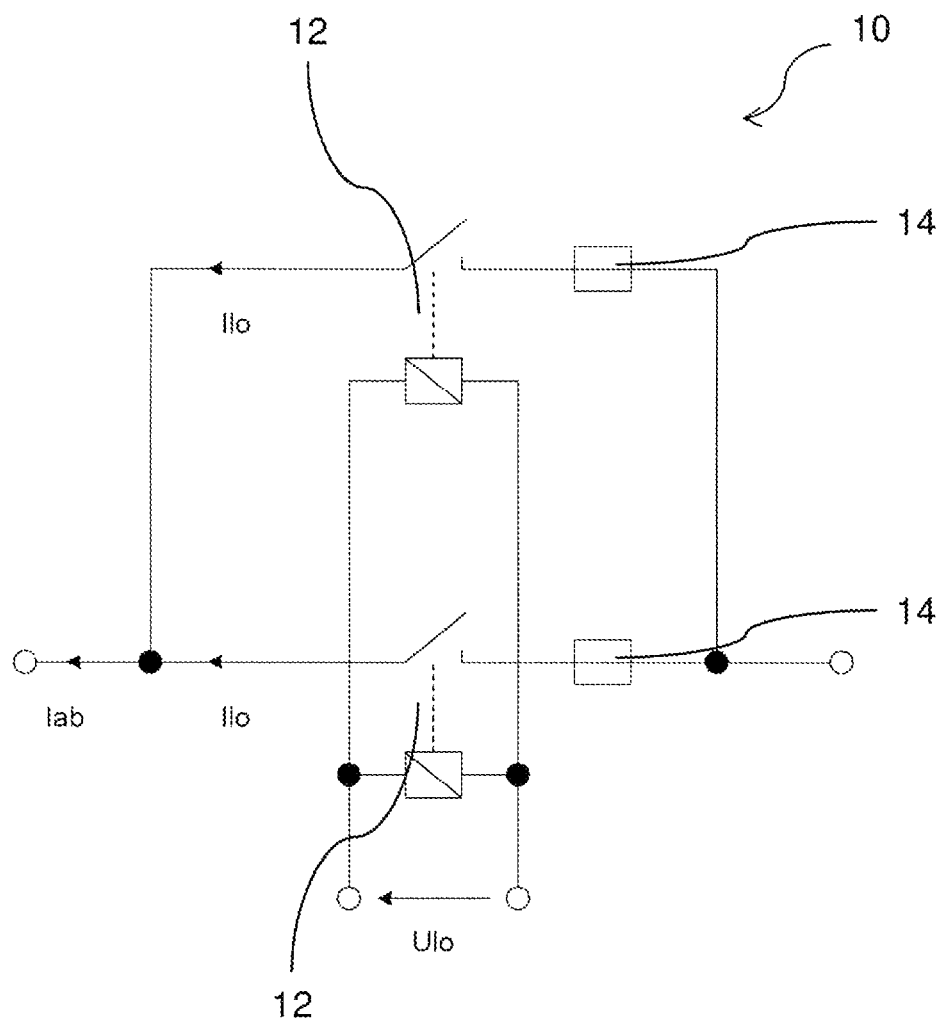
FIG. 4 is a detailed depiction of a single switch of a switch device of the apparatus from FIG. 1 according to a second modified embodiment.

FIG. 4 shows an individual switch 10 according to a second modified embodiment. The individual switch 10 of the second modified embodiment is essentially identical to the one described in relation to the first embodiment so that components that are the same have been provided with identical reference numerals.

The individual switch 10 according to the second modified embodiment differs from the one described previously in that it includes a parallel circuit composed of two switch elements 12, which are embodied in the form of a relay for low-level signals, for example, in order to transmit small signals. The individual switch 10 also includes two current-limiting elements 14 and the switch elements 12 for conducting small signals are each assigned to one of them. The individual switch 10 is embodied to produce an essentially uniform distribution of a signal current to the multitude of switch elements 12 for conducting small signals.

As a further difference, the single switch of the second modified embodiment does not have the resistor 15. In the embodiment according to FIG. 4, each individual one of the two—for example, identical—switch elements 12 is provided and equipped for transmitting low-level signals and through the uniform distribution of the signal current to these two switch elements 12, the summation of the partial currents through these switch elements 12 results in the fact that in addition to a low-level signal, it is also possible to transmit a high-level signal through the parallel circuit. As a result, in FIG. 4, there is no longer the reason from FIG. 2 to use a resistor 15 to produce a nonuniform distribution of the signal current over the two switch elements.

Figure 5:
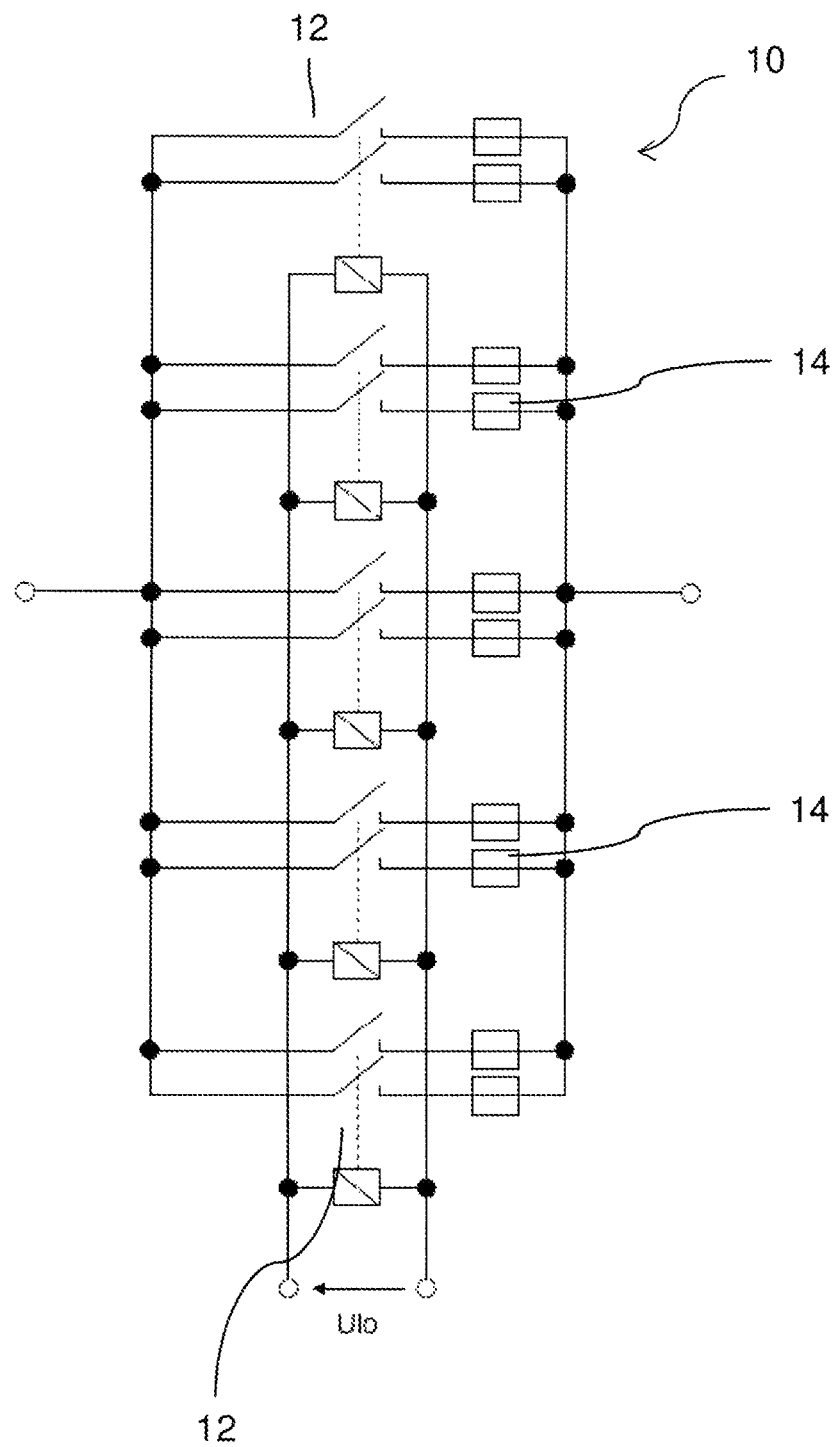
FIG. 5 is a detailed depiction of a single switch of a switch device of the apparatus from FIG. 1 according to a third modified embodiment.

FIG. 5 shows an individual switch 10 according to a third modified embodiment. The individual switch 10 of the third modified embodiment is essentially identical to the one described in relation to the second modified embodiment shown in FIG. 4 so that components that are the same have been provided with identical reference numerals.

The individual switch 10 according to the third modified embodiment differs from the one described previously in that it includes a parallel circuit composed of five switch elements 12 for transmitting small signals. Each switch element 12 is embodied in the form of a Tyco Schrack RT425024 double changer with two individual switch contacts. Accordingly, the five switch elements 12 have ten switch contacts that permit a constant current of 80 Aeff. The control power is approx. 2 Watts.

Figure 6:
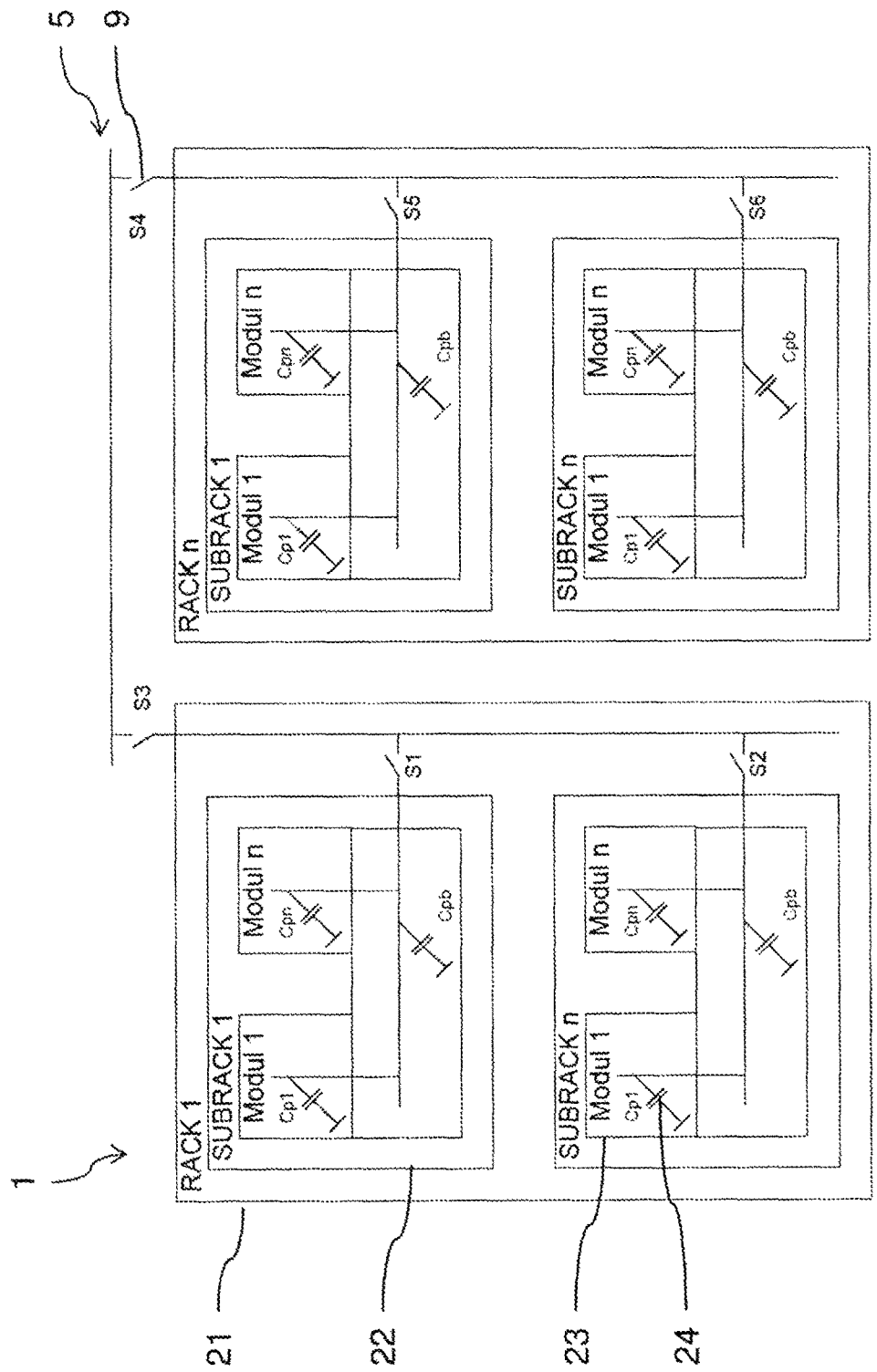
FIG. 6 is a schematic depiction of an apparatus for testing an electrical component according to a second embodiment of the invention.

FIG. 6 shows an apparatus 1 according to a second embodiment. The apparatus 1 of the second embodiment is essentially identical to that of the first embodiment so that parts which are the same have been provided with identical reference numerals. In particular, FIG. 6 shows an example of a specific implementation of the apparatus 1.

As shown in FIG. 6, the apparatus 1 includes a plurality of racks 21, which are embodied as so-called 19-inch cabinets as supports of sub-racks 22. The sub-racks 22 are embodied in the form of so-called 19-inch subassembly supports, with or without plug contacts for detachable modules 23 or printed circuit boards that are connected to the 19-inch subassembly supports. Each sub-rack 22 includes a plurality of modules 23 that here are embodied as input/output modules, which are often referred to for short as I/O modules, e.g. a module for measuring signals or a module for generating signals. Parasitic capacitances 24 are depicted relative to ground in FIG. 6.

Racks 21, sub-racks 22, and modules 23 in this case can be connected to one another via a connecting device 5. Racks 21, sub-racks 22, and modules 23 thus constitute hierarchy levels. Switch devices 9 are arranged to respectively make or break the connection between two levels 21, 22, 23.

The apparatus of the second exemplary embodiment permits a simultaneous and independent error simulation in rack 1 and rack n. For example, it is possible for there to be a short-circuit of signals from rack 1, sub-rack 1, module 1 to rack 1, sub-rack n, module 1 and simultaneously from rack n, sub-rack 1, module 1 to rack n, sub-rack n, module 1. Correspondingly, switch devices 9 with the reference numerals S1, S2, S5, and S6 are closed while switch devices 9 with the reference numerals S3 and S4 are open.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An apparatus for testing an electrical component, the apparatus comprising:
    a simulation unit for producing a simulation signal that is transmitted to the electrical component under testing, the simulation unit connecting an electrical connecting device to the electrical component;
    a plurality of test units providing sensor and actuator signals to the simulation unit,
    wherein at least one of the plurality of test units are connected via the electrical connecting device to the simulation unit, the plurality of test units and the simulation unit being connected directly to the electrical connecting device,
    wherein the electrical connecting device has at least one electrical switch device, which is arranged to make or break an electrical connection between at least one of the plurality of test units and the connecting device,
    wherein the electrical component is separate from the apparatus,
    wherein the electrical connecting device is one of a plurality of electrical connecting devices, which differ from one another with regard to at least one electrical property, and
    wherein the apparatus further comprises:
    a selecting device for selecting an electrical connection of the simulation unit and the plurality of test units to one of the electrical connecting devices, the plurality of electrical connecting devices each have at least one electric switch device, the electrical switch devices being arranged so that they make or break an electrical connection between the plurality of test units via the corresponding electrical connecting device.

2. The apparatus according to claim 1, wherein a majority of the electrical switch devices of the electrical connecting devices are embodied together as a switch unit.

3. The apparatus according to claim 1, wherein the at least one switch device has at least one electrical property that is adapted to at least one electrical property of the electrical connecting device that is connected to the switch device.

4. The apparatus according to claim 1, wherein the apparatus switches the at least one switch device in a load-free and/or voltage-free fashion.

5. The apparatus according to claim 1, wherein the electrical connecting device is hierarchically situated in at least two levels and the at least one switch device makes or breaks a connection between two levels.

6. The apparatus according to claim 1, wherein the at least one switch device is a semiconductor switch.

7. The apparatus according to claim 6, wherein the semiconductor switch is a MOSFET.

8. The apparatus according to claim 7, wherein the semiconductor switch has a series circuit composed of two MOSFETs that are essentially identically structured, wherein each MOSFET has a body diode, and wherein the semiconductor switch is embodied so that the respective conducting directions of the body diodes of the two MOSFETs are oriented in opposite directions from each other.

9. The apparatus according to claim 1, wherein the at least one switch device has an electromechanical switch.

10. The apparatus according to claim 1, wherein at least one test unit is connected to an electronic control unit.

11. The apparatus according to claim 1, wherein the simulation unit is integrally joined to at least one test unit.

12. The apparatus according to claim 1, wherein the at least one switch device has a parallel circuit of a plurality of switch elements.

13. The apparatus according to claim 12, wherein the apparatus controls the plurality of switch elements of a switch device together.

14. The apparatus according to claim 13, wherein the at least one switch device has a switch element for transmitting small signals.

15. The apparatus according to claim 13, wherein the at least one switch device has a plurality of switch elements for transmitting small signals.

16. The apparatus according to claim 13, wherein the at least one switch device produces a uniform or essentially uniform distribution of a signal current to a plurality of switch elements.

17. The apparatus according to claim 12, wherein the at least one switch device has a switch element for transmitting large signals.

18. The apparatus according to claim 13, wherein the at least one switch device has a switch element for transmitting small signals and a switch element for transmitting large signals.

19. The apparatus according to claim 12, wherein at least one switch element includes a semiconductor switch.

20. The apparatus according to claim 12, wherein at least one switch element is an electromechanical switch.

21. The apparatus according to claim 1, wherein the at least one switch device is a functional unit.

22. A system, comprising:
    an electrical component; and
    an apparatus for testing the electrical component, the apparatus being separate from the electrical component and comprising:
    a simulation unit for producing a simulation signal that is transmitted to the electrical component;

a plurality of test units connected to an electrical connecting device, the test units being peripheral devices used with the electrical component, the test units and the simulation unit providing a test environment for the electrical component;

wherein the simulation unit being connected via the electrical connecting device to at least one of the test units, wherein the simulation unit and the plurality of test units are connected directly to the electrical connecting device, the electrical component under test being separated from the test units by the simulation unit, and wherein the electrical connecting device has at least one electrical switch device, which is arranged to make or break an electrical connection between at least one of the plurality of test units and the electrical connecting device; wherein the electrical connecting device is one of a plurality of electrical connecting devices, which differ from one another with regard to at least one electrical property.

23. An apparatus for testing an electrical component, the apparatus comprising:

a simulation unit for producing a simulation signal that is transmitted to the electrical component; and a plurality of test units connected to a first electrical connecting device of at least two electrical connecting devices, the test units being peripheral devices used with the electrical component, the test units and the simulation unit providing a test environment for the electrical component;

wherein the simulation unit and the plurality of test units are connected directly to the first electrical connecting device of the two electrical connecting devices, wherein the at least two electrical connecting devices have different electrical properties, wherein the simulation unit is connected via the at least two connecting devices to at least two of the test units, wherein the simulation unit and the plurality of test units are connected directly to the first electrical connecting device, the electrical component under test being separated from the test units by the simulation unit, wherein the first electrical connecting device has at least one electrical switch device, which is arranged to make or break an electrical connection between the plurality of test units and the at least two electrical connecting devices, and wherein the electrical component is separate from the apparatus.

24. The apparatus according to claim 1, wherein the test units are peripheral devices connectable to the electrical component under test, the simulation unit coordinating signals from the test units to the electrical component under test.

25. The apparatus according to claim 23, wherein at least one of the test units are connected to the first electrical connecting device of the two electrical connecting devices via a first rack, wherein the first electrical connecting device is electrically connectable with a first rack via a third switch device, the first rack containing a first test unit, wherein the first electrical connecting device is electrically connectable with a second rack via a fourth switch device, the second rack containing a second test unit, such that total parasitic capacitances connected with the first electrical connecting device is changeable via the third switch device and via the fourth switch device.

26. The apparatus according to claim 1, wherein at least one of the test units is provided with a router to process signal channels provided to the simulator.

* * * * *